United States Patent [19]
Kamgar et al.

[11] Patent Number: 4,737,233
[45] Date of Patent: Apr. 12, 1988

[54] METHOD FOR MAKING SEMICONDUCTOR CRYSTAL FILMS

[75] Inventors: Avid Kamgar, Millington; Ernest Labate, South Plainfield; Joseph R. Ligenza, Flanders; Simon M. Sze, New Providence, all of N.J.

[73] Assignee: American Telephone and Telegraph Company, AT&T Bell Laboratories, Murray Hill, N.J.

[21] Appl. No.: 901,975

[22] Filed: Sep. 2, 1986

Related U.S. Application Data

[63] Continuation of Ser. No. 663,823, Oct. 22, 1984, abandoned, which is a continuation of Ser. No. 395,358, Jul. 6, 1982, abandoned.

[51] Int. Cl.[4] .............................................. C30B 13/22
[52] U.S. Cl. ....................... 156/620.73; 156/DIG. 73; 156/DIG. 80; 156/DIG. 88; 156/DIG. 102; 427/53.1
[58] Field of Search ............... 156/603, 620, DIG. 64, 156/DIG. 73, DIG. 80, DIG. 88, DIG. 102, DIG.103; 29/576 T; 75/65 ZM; 427/53.1

[56] References Cited

U.S. PATENT DOCUMENTS

| | | | |
|---|---|---|---|
| 3,160,522 | 12/1964 | Heywang et al. | 156/DIG. 88 |
| 3,600,237 | 8/1971 | Davis et al. | 156/620 |
| 3,943,324 | 3/1976 | Haggerty | 156/620 |
| 4,012,236 | 3/1977 | Anthony et al. | 156/620 |
| 4,120,743 | 10/1978 | Baghdadi et al. | 156/620 |
| 4,135,027 | 1/1979 | Anthony et al. | 156/620 |
| 4,184,065 | 1/1980 | Nagashima | 156/620 |
| 4,330,363 | 5/1982 | Biegesen et al. | 156/603 |
| 4,343,829 | 8/1982 | Tochikubo et al. | 156/DIG. 73 |
| 4,383,883 | 5/1983 | Mizutani | 156/603 |
| 4,482,395 | 11/1984 | Hiramoto | 29/576 T |

FOREIGN PATENT DOCUMENTS

| | | | |
|---|---|---|---|
| 23781 | 3/1981 | Japan | 156/DIG. 80 |
| 45047 | 4/1981 | Japan | 156/DIG. 73 |
| 1225 | 1/1982 | Japan | 156/DIG. 80 |
| 23218 | 2/1982 | Japan | 156/DIG. 80 |
| 97620 | 6/1982 | Japan | 156/DIG. 80 |
| 262861 | 6/1970 | U.S.S.R. | 156/620 |

OTHER PUBLICATIONS

*Laser and Electron-Beam Solid Interactions and Materials Processing,* "CW Laser-Recrystallized, Polysilicon as a Device-Worthy Material", 1982, pp. 449–462, by J. Gibbons.

*Laser and Electron-Beam Interactions with Solids,* "Seeded Growth of Si over $SiO_2$ Substrates by CW Laser Irradiation", 1982, pp. 505–510, by L. E. Trimble et al.

*Applied Physics Letters,* "Seeded Oscillatory Growth of Si over $SiO_2$", vol. 40 (1982), pp. 1043–1045, by G. K. Celler et al.

M. W. Geis et al., Applied Physics Letters, "Zone--Melting Recrystallization of Encapsulated Silicon Films on $SiO_2$-Morphology and Crystallography", vol. 40 (1982), pp. 158–160.

R. F. Pinizzotto et al., Applied Physics Letters, "Subgrain Boundaries in Lateral Seeded Silicon–on–Oxide Formed by Graphite Strip Heater Recrystallization", vol. 40 (1982), pp. 388–390.

J. R. Lineback, Electronics, "Oxide Insulator Looks the Equal of Sapphire for C-MOS ICs", Jun. 2, 1982, pp. 45–46.

R. J. Von Gutfeld, Crystallization of Silicon for Solar Cell Applications, IBM Technical Disclosure Bulletin, vol. 19, No. 10, Mar. 1977, pp. 3955–3956.

*Primary Examiner*—David L. Lacey
*Attorney, Agent, or Firm*—Peter A. Businger

[57] ABSTRACT

Semiconductor crystal films on a dielectric substrate are advantageously made by a zone melting method. Single-crystal structure is initiated at a seed surface, and made to extend across a dielectric surface by melting and resolidifying.

Melting is effected upon irradiation with optical radiation which is focused onto an elongated zone; the zone is moved so as to locally melt successive portions of a layer of precursor material which may be amorphous or polycrystalline. The use of incoherent radiation is convenient, and focusing is typically by using a reflector.

The process is conveniently effected under a controlled atmosphere and the layer being crystallized may be encapsulated so that no free semiconductor surface is exposed to an atmosphere.

7 Claims, 1 Drawing Sheet

METHOD FOR MAKING SEMICONDUCTOR CRYSTAL FILMS

This application is a continuation of application Ser. No. 663,823, filed Oct. 22, 1984, now abandoned, which was a continuation of application Ser. No. 395,358, filed July 6, 1982, now abandoned.

TECHNICAL FIELD

The invention is concerned with the manufacture of semiconductor thin film crystals on insulating substrates especially as desired in high-speed and/or highly integrated circuits.

BACKGROUND OF THE INVENTION

As semiconductor integrated circuit technology moves towards increasing device speed (Very High Speed Integrated Circuit, VHSIC) and towards the integration of ever larger numbers of functional elements as a single circuit (Very Large Scale Integration, VLSI) it is considered increasingly important to realize devices not at bulk semiconductor surfaces but in thin layers whose thickness is chosen to meet device specifications. Accordingly, methods are being sought for producing semiconductor crystals in the form of thin layers or films on an insulating substrate; desired layer thickness is typically less than approximately 2 micrometers, and desired layer diameter may be of the order of several inches.

Prominent among methods which have been proposed for the manufacture of such crystals are zone melting methods based on melting and resolidifying a layer of a starting or precursor material having a desired composition and being deposited on a dielectric, electrically insulating substrate; in this fashion device-grade layers may be obtained from amorphous or polycrystalline starting materials. For example, according to one method, melting and resolidifying take place as a laser beam sweeps back and forth while advancing in small steps; according to another, a graphite strip heater is moved slowly over a layer to be crystallized.

For the case of silicon films, the former technique is described, e.g., in the following papers:

J. F. Gibbons, "CW Laser-Recrystallized, Polysilicon as a Device-Worthy Material", Laser and Electron-Beam Solid Interactions and Materials Processing J. Gibbons et al., editors, North Holland, 1982, pp. 449–462;

L. E. Trimble et al., "Seeded Growth of Si over $SiO_2$ Substrates by CW Laser Irradiation", Laser and Electron-Beam Interactions with Solids B. R. Appleton et al., editors, North Holland, 1982, pp. 505–510; and C. K. Celler et al., "Seeded Oscillatory Growth of Si over $SiO_2$ by CW Laser Irradiation", Applied Physics Letters, Vol. 40 (1982), pp. 1043–1045.

Similarly, the use of a graphite strip heater is described, e.g., in the following papers:

M. W. Geis et al., "Zone-Melting Recrystallization of Encapsulated Silicon Films on $SiO_2$-Morphology and Crystallography", Applied Physics Letters, Vol. 40 (1982), pp. 158–160;

R. F. Pinizzotto et al., "Subgrain Boundaries in Laterally Seeded Silicon-on-Oxide Formed by Graphite Strip Heater Recrystallization", Applied Physics Letters, Vol. 40 (1982), pp. 388–390; and J. R. Lineback, "Oxide Insulator Looks the Equal of Sapphire for C-MOS ICs", Electronics, June 2, 1982, pp. 45–46.

Methods as described in the above-cited references demonstrate the applicability of zone melting for the production of thin-film semiconductor crystals. However, while considered satisfactory for producing small-diameter crystal layers, these methods are considered not to be readily adaptable to the production of large-size, commercially significant crystal films.

SUMMARY OF THE INVENTION

A semiconductor crystal film is made on a dielectric material by a zone melting method applied to a precursor layer on a substrate. A portion of the precursor layer material is in contact with a seed area at which crystallization is initiated by localized heating of an elongated zone by means of focused optical radiation. The resulting elongated molten zone is propagated by essentially unidirectional motion, starting from the seed area, to crystallize precursor material overlying dielectric material.

DETAILED DESCRIPTION

Figure 1:
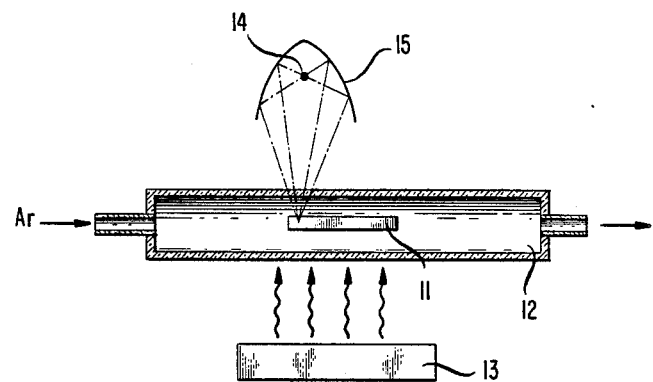
FIG. 1 is a schematic, cross-sectional elevation of apparatus as may be used in processing in accordance with the invention.

FIG. 1 shows assembly 11 inside optically transparent enclosure 12 being irradiated from below by stationary radiation source 13. In combination, movable radiation source 14 and reflector 15 focus light onto an elongated area of assembly 11 (the major axis of such area is typically in a direction which is essentially perpendicular to the plane of the drawing).

Figure 2:
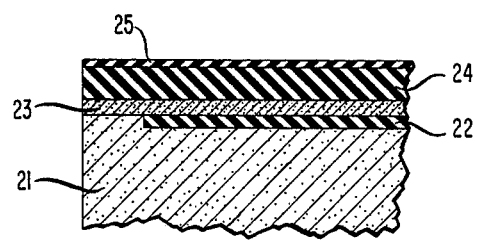
FIG. 2 is a schematic, cross-sectional elevation of a typical layered structure or assembly or wafer to which processing in accordance with the invention is applicable.

FIG. 2 is an enlarged view of a portion of assembly 11 and shows substrate 21, dielectric layer 22, semiconductor layer 23, dielectric layer 24, and dielectric layer 25.

Semiconductor layer 23 is a precursor layer which initially does not have single-crystal form and which is transformed into such form by processing in accordance with the invention. The material of layer 23 may be any desired doped or undoped semiconductor material to be crystallized; typical materials are silicon, germanium, indium phosphide, gallium arsenide, and indium gallium arsenide phosphide.

A portion of substrate 21 is shown in contact with layer 23 such that, when substrate 21 is a crystal whose lattice parameters are essentially compatible with the lattice parameters of the crystal to be produced, crystalline order is induced in layer 23 upon melting and solidifying in the area of contact. When a molten zone then travels away from such area and over insulating layer 22, melting and solidifying in layer 23 cause a traversed swath to turn single-crystal. A "seed area" at which crystalline order is initially induced is preferably (but not necessarily) coplanar with the insulating material surface.

In accordance with the invention such melting and resolidifying is effected upon irradiation of an elongated zone by means of focused optical radiation from radiation source 14, such radiation being focused onto the elongated zone, e.g., by reflector 15. Focusing may conveniently be adjusted, e.g., by appropriate choice of distance between a radiation source-reflector assembly and a wafer being processed.

Radiation from source 14 preferably has an energy peak at a wavelength which is less than the wavelength corresponding to the bandgap energy of the semiconductor material being crystallized. For example, wavelengths less than approximately 1.1 micrometer are preferred for crystallizing a silicon layer.

Preferred aspect ratio of the molten zone is at least 2 and preferably at least 10; on account of such elongated shape, the term "line-heating" may be used in connection with the method. Width of the zone as measured perpendicular to a direction of travel typically is at least 1 inch, and widths of 3, 4, and 5 inches are particularly significant in silicon semiconductor processing. The method is easily adapted to any desired width.

Zone melting and resolidifying take place as the zone travels in layer 23, e.g., as the radiation source 14 and reflector 15 are laterally displaced by a motor drive. Alternatively, it may be the assembly 11 which is being displaced by a motor drive, or the reflector 15 may be rotated through an appropriate angle so as to result in propagation of the molten zone for a desired distance. Rate of advancement of the molten zone is typically in the range of 1-100 millimeters per minute.

Zone melting may be facilitated by an optional auxiliary heater or radiation source 13 which raises the temperature of assembly 11 to a temperature below the melting temperature of the material of layer 23. Source 13 may consist, e.g., of one or several halogen lamps, and one or several similar lamps may be used also for radiation source 14. Layer 23 may be protected by one or several dielectric layers 24 and 25; alternatively (or in combination with such dielectric layers), assembly 11 is placed in chamber 12 which may be provided with a continuously moving atmosphere, e.g., of an inert gas such as argon. Alternate optically transparent, physically essentially impermeable protective media between a radiation source and a wafer are not precluded.

Among advantages of zone melting using focused radiation in accordance with the invention are the following:

(i) On account of the elongated shape of the molten zone, simple, essentially unidirectional motion is sufficient for zone melting. This is contrasted with the need for back-and-forth motion when laser radiation is used.

(ii) The assembly being processed is physcaly protected from the radiation source and not exposed to potential contamination by extraneous matter as may be produced, e.g., by a carbon strip heater in close proximity to a layer being heated.

(iii) On account of the relatively large area being heated at any one time, processing speed compares favorably with that of laser heating.

(iv) Use of focusing means producing an elongated zone makes processing readily adaptable for crystallizing large wafers in a single pass. Wafers having a diameter of 3, 4, or even 5 inches are processed easily and economically.

(v) There is no need for coherent radiation as in laser processing, and the use of incoherent light is effective, convenient, and economical.

(vi) As compared with laser processing, large wafers are processed with less likelihood of undue stress developing.

EXAMPLE

On a three-inch silicon wafer having (100) orientation, a 600 Angstrom layer of silicon dioxide was grown by heating in an oxygen atmosphere. A 300 Angstrom thick layer of silicon nitride was deposited on the silicon dioxide and the assembly was then etched down to the substrate except for a 0.25 inch wide strip alongside the (110) flat. A silicon dioxide layer was regrown on the exposed portion to a thickness of approximately 1 micrometer and the assembly was then etched to produce an essentially level surface consisting of silicon near the flat and of silicon dioxide elsewhere. Polysilicon was deposited by low-pressure chemical vapor deposition across the entire surface and encapsulated by chemical vapor deposition of silicon dioxide and silicon nitride. The wafer was placed in a quartz tube under flowing argon and heated from below to a temperature of approximately 1200 degrees C. by irradiation with a high-density tungsten lamp unit. Line-heating was by means of a tungsten lamp with dual elliptical reflectors. Zone melting was initiated over the seed area and a molten zone was advanced at a rate of approximately 0.1 millimeter per second by motor-driven movement of the lamp assembly. The molten zone was approximately elliptical with axes of approximately 4 millimeters and 50 millimeters.

The processed wafer was inspected microscopically and by X-ray analysis and was observed to be a single crystal having (100) orientation.

What is claimed is:

1. A method for making a semiconductor crystal film on a substrate,
    said substrate having a surface which comprises a first area and a second area,
    said first area consisting essentially of a desired crystal lattice which is compatible with the lattice of a desired smiconductor material,
    said second area being contiguous to said first area and consisting essentially of at least one dielectric material,
    a semiconductor precursor layer being disposed on said first area and said second area and extending across a boundary between said first area and said at least one dielectric material,
    said method comprising crystallizing said semiconductor precursor layer on at least a portion of said at least one dielectric material by melting and resolidifying said precursor layer,
    said melting and resolidifying being by localized heating of said precursor layer so as to cause a molten zone to travel in a first direction from a boundary between said first area and said at least one dielectric material,
    said molten zone being elongated in a second direction which has a substantial component perpendicular to said first direction,
    melting in said zone being effected in part by irradiating said zone by means of a source of focused optical radiation and in part by irradiating said substrate by means of a source of essentially unfocused optical radiation while said substrate is separated by an optically transparent, physically essentially impermeable medium from said source of focused optical radiation and said source of essentially unfocused optical radiation to prevent contamination of said substrate by extraneous matter, and travel of said molten zone in said first direction being essentially free of travel in said second direction.

2. The method of claim 1 in which said focused optical radiation has an energy peak at a wavelength which is less than or equal to the wavelength which corresponds to the bandgap energy of said semiconductor material.

3. The method of claim 1 in which said focused optical radiation is incoherent.

4. The method of claim 1 in which said zone has an aspect ratio which is greater than or equal to 2.

5. The method of claim 1 in which said zone has a width which is greater than or equal to 1 inch as measured in a direction perpendicular to a direction of travel of said zone.

6. The method of claim 1 in which said zone travels essentially unidirectionally at a rate which is in the range from 1 to 100 millimeters per minute.

7. The method of claim 1 in which said focused optical radiation is focused by means of a reflector.

* * * * *